United States Patent
Chang et al.

(10) Patent No.: US 9,032,162 B1
(45) Date of Patent: May 12, 2015

(54) SYSTEMS AND METHODS FOR PROVIDING MEMORY CONTROLLERS WITH MEMORY ACCESS REQUEST MERGING CAPABILITIES

(75) Inventors: Ching-Chi Chang, San Jose, CA (US); Ravish Kapasi, Fremont, CA (US); Jeffrey Schulz, Milpitas, CA (US); Michael H. M. Chu, Fremont, CA (US); Caroline Ssu-Min Chen, Milpitas, CA (US); Chiakang Sung, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 303 days.

(21) Appl. No.: 13/209,137

(22) Filed: Aug. 12, 2011

(51) Int. Cl.
*G11C 7/10* (2006.01)

(52) U.S. Cl.
CPC .................... *G11C 7/1075* (2013.01)

(58) Field of Classification Search
None
See application file for complete search history.

(56) References Cited

U.S. PATENT DOCUMENTS

| | | | |
|---|---|---|---|
| 5,459,842 A | 10/1995 | Begun et al. | |
| 5,986,677 A | 11/1999 | Jones et al. | |
| 6,134,632 A | 10/2000 | Looi et al. | |
| 7,480,781 B2 | 1/2009 | Natarajan et al. | |
| 2008/0086594 A1* | 4/2008 | Chang et al. | 711/118 |
| 2009/0300297 A1 | 12/2009 | Ikeuchi et al. | |
| 2010/0281231 A1 | 11/2010 | Krishnan | |
| 2013/0205100 A1* | 8/2013 | Sato et al. | 711/149 |

\* cited by examiner

*Primary Examiner* — Brian Peugh
(74) *Attorney, Agent, or Firm* — Treyz Law Group; Jason Tsai

(57) ABSTRACT

An integrated circuit may include a memory controller serving as an interface between master processing modules and system memory. The master processing modules may provide memory access requests to the memory controller along with respective tag identifications. The memory controller may place the memory access requests in a queue for fulfillment. The memory controller may include a merging module that generates a memory access request to replace two or more memory access requests previously received from the master processing modules. The merging module may store information associated with the memory access requests that were merged and use the stored information to assign appropriate tag identifications to portions of data obtained from system memory when fulfilling the generated memory access request. The memory controller may include a verification module that can be used with test equipment to optimize the design of the master processing modules for improved memory access performance.

19 Claims, 10 Drawing Sheets

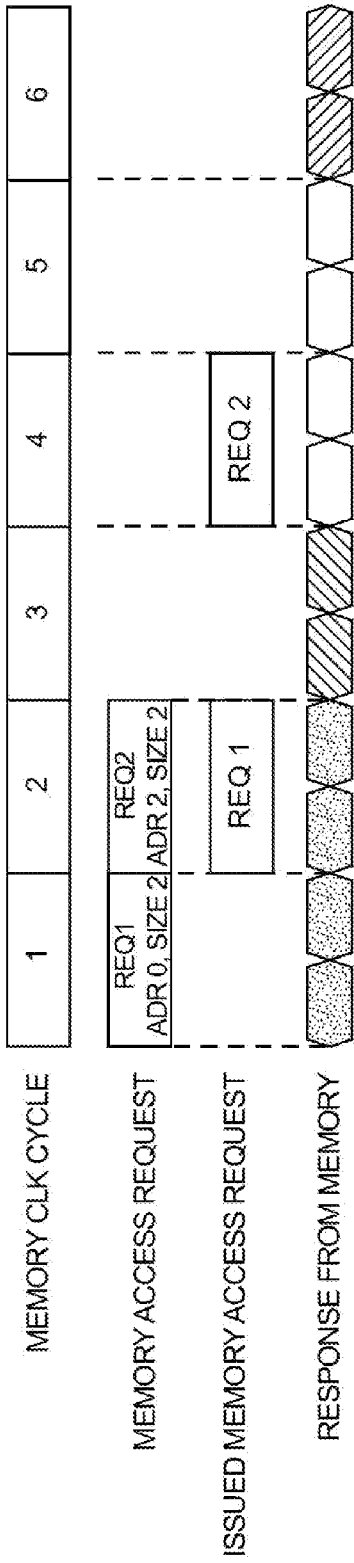
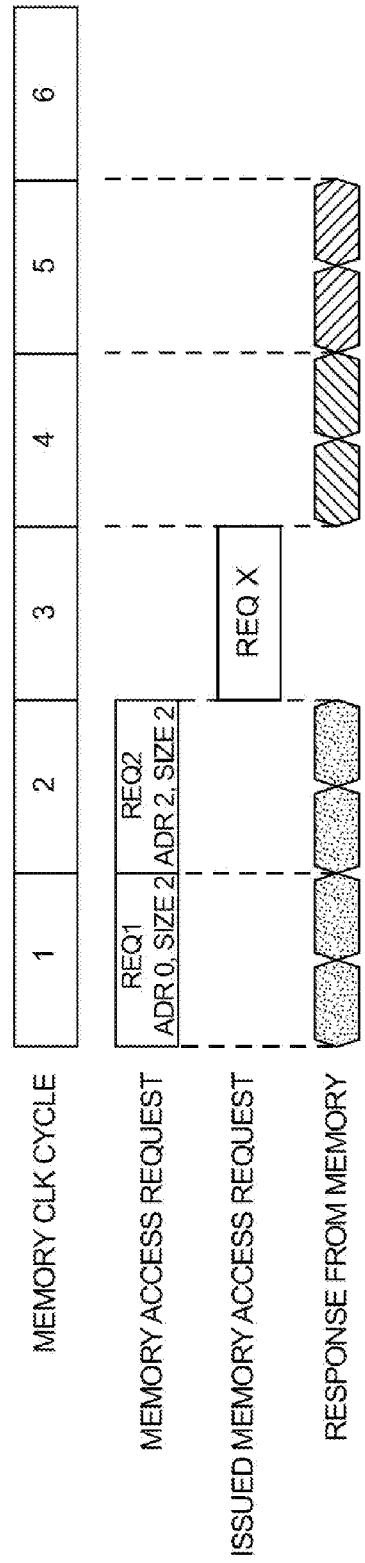
FIG. 2A (PRIOR ART)
FIG. 2B

TRANSACTION ID

SYSTEMS AND METHODS FOR PROVIDING MEMORY CONTROLLERS WITH MEMORY ACCESS REQUEST MERGING CAPABILITIES

BACKGROUND

Integrated circuits often contain memory controllers for interfacing with memory. In a typical system, an integrated circuit can be used to communicate with system memory. In particular, the integrated circuit includes a memory controller that serves as an interface between the integrated circuit and the system memory. The integrated circuit also includes processing modules configured to access system memory by sending memory access requests to the memory controller (i.e., the memory controller includes multiple ports each of which receives memory access requests from a respective processing module within the integrated circuit).

Conventional system memory can only be configured to fulfill a limited number of memory access requests within a given time period (i.e., bandwidth is limited by the speed at which the memory controller can fulfill received memory access requests). For example, a memory controller may receive 12 memory access requests but system memory may only be able to fulfill eight of these memory access requests within a given number of clock cycles.

SUMMARY

An integrated circuit may be used to communicate with system memory. The integrated circuit may include multiple processing modules that are operable to perform tasks that require access to system memory. The integrated circuit may also include a memory controller that serves as an interface between the different modules and system memory. The various modules may be coupled to the memory controller and may sometimes be referred to herein as "master" processing modules.

The master processing modules may provide memory access requests to the memory controller that request access to portions of system memory. The memory access requests may be provided with respective tag identifications. The memory controller may place the memory access requests in a queue for fulfillment. The memory controller may include a merging module that generates a memory access request to replace two or more memory access requests in the fulfillment queue. The merging module may store information associated with the memory access requests (e.g., identification tags associated with the memory access requests that were merged and amounts of data that are requested by the memory access requests that were merged).

The memory controller may issue memory access requests in the fulfillment queue (e.g., by directing system memory to respond to the memory access requests) and receive corresponding data from system memory. The memory controller may use the stored information to partition the received data into respective portions, each of which is associated with a corresponding memory access request (e.g., a memory access request originally received from the master processing modules). The memory controller may assign appropriate tag identifications to each portion of the received data and provide each portion of the received data (along with the assigned tag identification) to the appropriate master processing module based on the stored information.

The memory controller may also include a verification module that can be used with test equipment to optimize the design of the master processing modules for improved memory access performance. The verification module may be used to monitor the order and time at which memory access requests are received and issued by the memory controller. To monitor the order and time at which memory access requests are issued by the memory controller, the verification module may use identification tags (e.g., tag IDs) associated with each of the memory access requests.

Further features of the present invention, its nature and various advantages will be more apparent from the accompanying drawings and the following detailed description.

BRIEF DESCRIPTION OF THE DRAWINGS

FIG. 2A is a diagram showing fulfillment of memory access requests using a conventional memory controller.

FIG. 2B is a diagram illustrating merging of memory access requests in accordance with an embodiment of the present invention.

DETAILED DESCRIPTION

Figure 1:
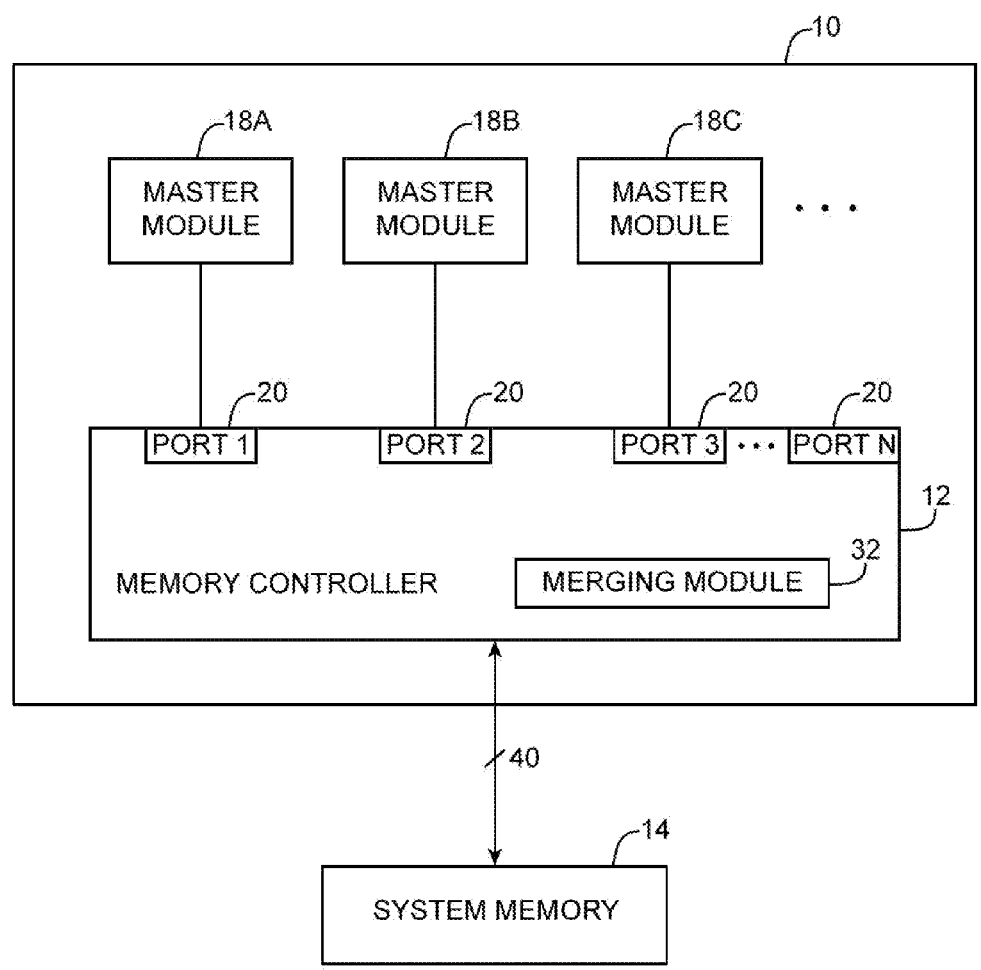
FIG. 1 is a diagram of an illustrative integrated circuit operable to communicate with system memory in accordance with an embodiment of the present invention.

Embodiments of the present invention relate to integrated circuits that contain memory controllers. Integrated circuits may include processing modules such as general purpose processing modules or processing modules that perform specific tasks. Processing modules may be used to perform tasks that require access to system memory (e.g., to store data for later retrieval).

Each processing module that communicates with the memory controller may sometimes be referred to as a "master" processing module (or master). The memory controller may have ports coupled to respective master processing modules.

A master processing module may send a memory access request to the memory controller when the master processing module needs to access system memory. For example, a master processing module may send a read access request to the memory controller to retrieve data from memory. The memory controller may receive the read access request and fulfill the read access request by providing control signals to system memory (e.g., the memory controller may receive the read access request and provide control signals to system memory that configure system memory to respond with the requested data). As another example, the master processing module may send a write access request to the memory controller along with corresponding write data to be loaded into system memory. The memory controller may receive the write access request and fulfill the write access request by configuring system memory to overwrite system memory at the specified address.

Due to limitations of system memory, the memory controller can only fulfill a limited number of access requests within a given time period. For example, system memory may be formed from several memory banks (e.g., 4 or 8 memory banks). At any given time, each memory bank may be configured to fulfill only one memory access request (i.e., a second memory access request following a first memory access request to a memory bank may be delayed until the memory controller has finished fulfilling the first memory access request).

Each of the master processing modules may send a number of memory access requests to a corresponding port in the memory controller. Due to the limitations of system memory, the memory access requests from the master processing modules are processed in a sequential order. In order to process large numbers of memory access requests, the memory controller may be provided with a scheduling circuit (sometimes referred to as a scheduler or scheduling module) that receives memory access requests in parallel from the master processing modules and arranges the memory access requests in a desired order for serial processing (i.e., a desired order in which to fulfill the memory access requests from the masters).

A memory controller may fulfill each memory access request by configuring system memory to respond to that memory access request using different respective blocks of system memory. For example, a memory controller may receive a memory access request to read 16 bytes of data from system memory at a given address of system memory. In this scenario, the memory controller may be configured to direct system memory to respond to the memory access request with minimum-sized blocks of memory (e.g., in the case that a minimum-sized block of memory is four bytes, the memory controller may direct system memory to perform four transactions each of which provides four bytes of data). Fulfilling a memory access request in this way may be sometimes referred to as fulfilling the memory access request via a "burst" transaction.

In some scenarios, it may be desirable for the memory controller to merge two or more memory access requests that have been received from the master processing modules. For example, consider the scenario in which a single master processing module provides many read access requests in a relatively short period of time (e.g., a scenario in which the single master processing module provides more read access requests than the system memory can immediately fulfill). The memory controller may be unable to immediately fulfill all of the read access requests due to limitations of system memory. In this scenario, some of the read access requests may be placed in a queue while other read access requests are being fulfilled. Some of the queued requests may request data portions that are smaller than a configured burst size (sometimes referred to as burst length). As an example, a first queued read access request may request two bytes of data while the configured burst size may be four bytes. In this case, the first queued read access request may be combined with a second read access request that requests another two bytes of data in the system memory burst that includes the first read access request. By merging two or more requests into a single memory access request, memory controller efficiency may be improved and system memory bandwidth may be conserved.

To provide a memory controller with merging capabilities, the memory controller may be provided with a merging module. FIG. 1 shows an illustrative integrated circuit 10 that includes a memory controller having a merging module 32. Merging module 32 may be configured to identify memory access requests for merging and merge the identified memory access requests. As shown in FIG. 1, device 10 may include master processing modules 18A, 18B, and 18C (sometimes referred to herein as masters 18). Master processing modules 18 may include processing circuits such as general purpose processing circuits, video processing circuits, audio processing circuits, networking circuits, and other processing modules that require access to system memory.

Master processing modules 18 may be formed from hardened logic (e.g., as found in an application-specific integrated circuit). Alternatively, master processing modules 18 may be formed from programmable logic (e.g., logic configured using memory elements loaded with configuration data). As an example, master processing modules 18A, 18B, and 18C may be formed from programmable logic that can be reconfigured by re-routing data paths associated with the modules.

Memory controller 12 may serve as an interface between integrated circuit 10 and system memory 14. System memory 14 may, for example, be formed from double data rate synchronous dynamic random access memory (e.g., DDR1, DDR2, and DDR3 SDRAM) or other suitable types of memory. Memory controller 12 may be coupled to system memory 14 via path 40. Device 10 may use memory controller 12 to communicate with system memory 14 by providing memory controller 12 with read access requests and write access requests. Memory controller 12 may fulfill the memory access requests by directing system memory 14 to respond to the memory access requests. For example, device 10 may provide memory controller 12 with a read access request to read a word of data (4 bytes) from a desired address within system memory 14. In response to receiving the read request, memory controller 12 may process the request, generate corresponding control signals, and convey the control signals to system memory 14 via path 40. The control signals (e.g., system clock, memory address, and command signals) generated by memory controller 12 may direct system memory 14 to reply with data stored at the desired address. The control signals may direct system memory to respond in bursts of data (e.g., to respond to each memory access request using multiple transactions that each transfers a block of data).

As another example, device 10 may provide memory controller 12 with a write access request to write a word of data to a desired address in system memory 14. In response to receiving the write request, memory controller 12 may generate and transmit control signals (e.g., signals that direct system memory 14 to store the word of data at the desired address) to system memory 14 via path 40. The control signals may direct system memory to write the data in bursts (e.g., to write the data using multiple transactions each writing a minimum-sized block of data).

Master processing modules 18 may be configured to perform various tasks. For example, a first module 18A may be configured to perform general purpose tasks (e.g., module 18A may be configured as a general purpose processing module) and a second module 18B may be configured to perform other tasks (e.g., module 18B may be configured to perform video decoding tasks). Modules 18 (e.g., modules 18A and 18B) may require access to system memory 14 when performing certain tasks. For example, to complete video decoding tasks, module 18B may read and store data from specified addresses in system memory 14.

Modules 18 may be coupled to respective ports 20 in memory controller 12. For example, module 18A may be coupled to port 1, module 18B may be coupled to port 2, module 18C may be coupled to port 3, etc. The example of FIG. 1 having three processing modules is merely illustrative and is not intended to limit the scope of the present invention. If desired, zero master modules, two master modules, four or more master modules, ten or more master modules, or other processing circuitry that requires access to system memory 14 may be formed.

Many master processing modules (e.g., ten or more master processing modules) may be coupled to memory controller 12. The master processing modules may each require access to system memory at any given time. For example, several or all of the master processing modules may provide memory controller 12 with memory access requests within a single system clock cycle. Memory controller 12 can fulfill only a limited number of the memory access requests that it receives. For example, due to limitations specified by a memory interface protocol currently under use, memory controller 12 may only be able to configure system memory 14 to fulfill one memory access request at a time (e.g., memory access requests from masters 18A and 18B cannot be fulfilled simultaneously even if masters 18A and 18B send their requests to memory controller 12 in parallel).

Conventional memory controllers fulfill each memory access request separately. The example of FIG. 2A illustrates a scenario in which separate fulfillment of memory access requests results in inefficient use of available system memory bandwidth. As shown in FIG. 2A, a memory controller receives a first memory access request REQ1 at memory clock cycle 1 and receives a second memory access request REQ2 at clock cycle 2. Memory access request REQ1 requests two blocks of data (e.g., data corresponding to two minimum-sized blocks of data) at address 0, whereas memory access request REQ2 requests two blocks of data at address 2 (e.g., a data portion of size 2). During clock cycles 1, system memory is busy processing memory access requests received before clock cycle 1 and is unavailable to process memory access request REQ1. During clock cycle 2, system memory is still processing the memory access requests received before clock cycle 1, but is available to receive control signals in preparation for fulfilling memory access REQ1.

In FIG. 2A, the memory controller is configured to perform 4-block burst transactions (i.e., each burst transaction includes four separate transfers of one minimum-sized block of system memory). At clock cycle 2, the memory controller may issue memory access request REQ1 to system memory for fulfillment as a burst transaction during clock cycles 3 and 4. At clock cycle 3, the data corresponding to request REQ1 (i.e., a two-block memory portion corresponding to addresses 0 and 1) is provided by the system memory. However, because the memory controller is configured to perform 4-block burst transactions, the memory controller provides the data corresponding to addresses 2 and 3 (i.e., a two-block memory portion at address 2) during clock cycle 4.

At clock cycle 4, the memory controller issues memory access request REQ2. At clock cycle 5, the memory controller provides the data for addresses 0 and 1. At clock cycle 6, the memory controller provides the data for memory access request REQ2 (i.e., provides the data for addresses 2 and 3).

In the example of FIG. 2A, two memory clock cycles (i.e., memory clock cycles 4 and 5) are wasted because memory access requests REQ1 and REQ2 request portions of system memory that are smaller than the smallest transaction between the memory controller and system memory (e.g., REQ1 and REQ2 request data portions that are smaller than the configured burst size).

To improve the efficiency of memory access request fulfillment and improve the utilization of system memory bandwidth, the memory controller may merge selected memory access requests as shown in FIG. 2B. In the example of FIG. 2B, first memory access request REQ1 and second memory access request REQ2 may be received by memory controller 12 at respective memory clock cycles 1 and 2 while system memory 14 is unavailable (e.g., while system memory 14 is busy processing previously received memory access requests).

Memory access REQ1 and memory access REQ2 may be fulfilled within a single burst transaction. For example, memory access REQ1 may correspond to the data at memory addresses 0 and 1 (e.g., a first portion of memory located at address 0 with a size of 2), whereas memory access REQ2 may correspond to the data at memory addresses 2 and 3 (e.g., a second portion of memory of size 2 at address 2). Memory controller 12 may identify that memory access REQ1 and memory access REQ2 can be merged into a single burst memory transaction (e.g., a burst transaction including memory addresses 0-3). At clock cycle 3, memory controller 12 may issue a merged memory access request REQX to system memory 14 (e.g., memory access request REQX may include memory addresses 0 and 1 from request REQ1 and may include memory addresses 2 and 3 from request REQ2).

At clock cycles 4 and 5, system memory 14 may provide the data for memory access request REQX (e.g., data for memory addresses 0, 1, 2, and 3). Using the data obtained by issuing memory access request REQX, memory controller 12 may fulfill memory access requests REQ1 and REQ2. By merging requests REQ1 and REQ2, memory controller 12 may reduce the number of wasted clock cycles caused by fulfilling memory access requests that request data portions smaller than a minimum burst size.

Figure 3:
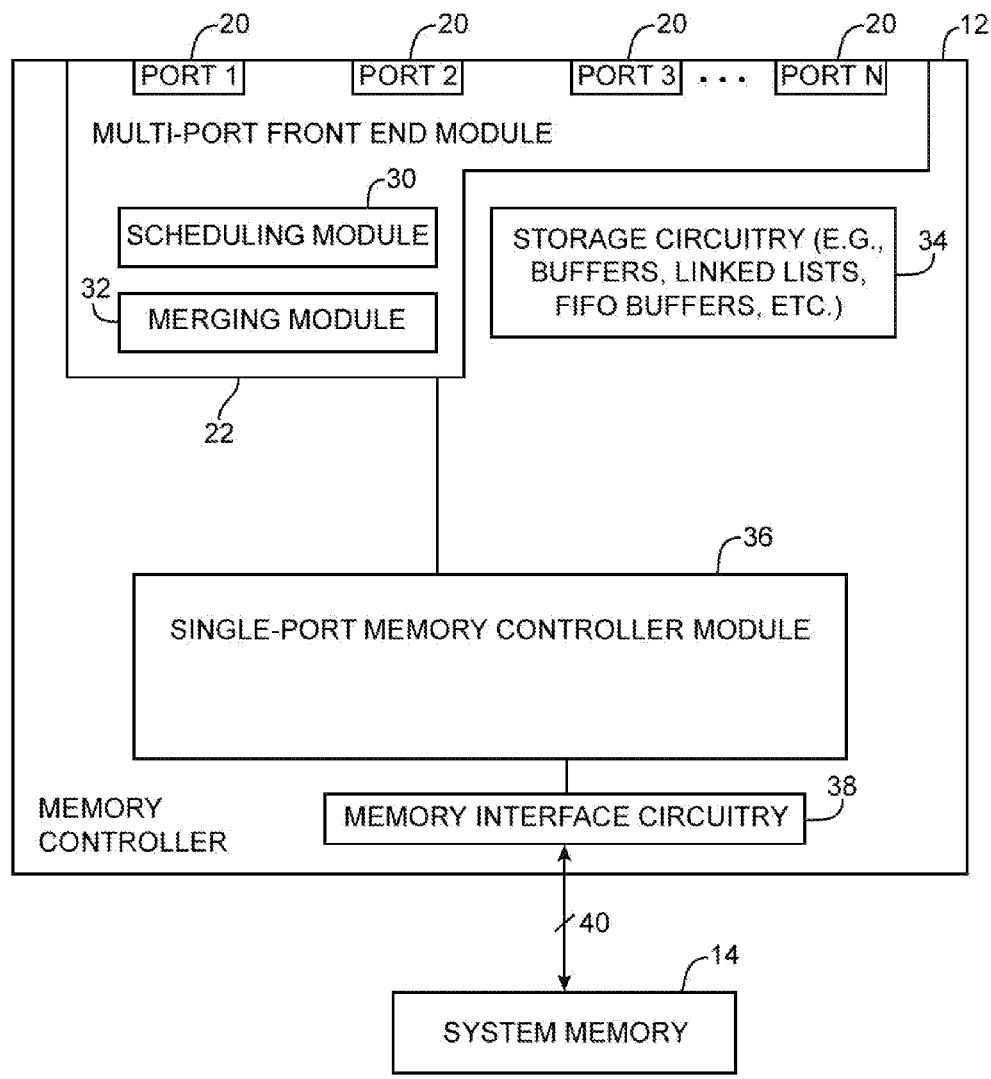
FIG. 3 is a diagram of an illustrative memory controller with a merging module in accordance with an embodiment of the present invention.

Memory controller 12 capable of merging memory access requests is shown in FIG. 3. As shown in FIG. 3, memory controller 12 may include a multi-port front end module 22 that receives memory access requests at multiple ports (e.g., port 1, port 2, port 3, . . . , port N). To accommodate memory access requests associated with multiple master processing modules each assigned a respective priority level and to accommodate memory access requests that exceed the fulfillment capabilities of system memory, multi-port front end module 22 may include a scheduling module 30.

Scheduling module 30 may receive memory access requests from each master module. Each memory access request may include information indicating the type of memory access request (e.g., a read access request, write access request, etc.), data associated with the memory access request (e.g., write data to be stored in system memory 14), address data (e.g., a system memory address corresponding to a location in system memory 14 at which to read or write data), identification information, or other desirable information associated with the memory access request. Scheduling module 30 may arrange the memory access requests in an order for fulfillment and place the arranged memory access requests in a queue for fulfillment (sometimes referred to herein as a fulfillment queue).

Memory controller 12 may include a merging module 32 that identifies memory access requests in the queue that are eligible for merging. Merging module 32 may also be configured to merge the identified memory access requests. Merging module 32 may generate new memory access requests based on the identified memory access requests and store the identified memory access requests in storage circuitry 34. The generated memory access requests may be inserted in the fulfillment queue in place of the memory access requests from which the merged requests were formed (e.g., in place of the original memory access requests). Storage circuitry 34 may include buffers, registers, linked lists, first-in-first-out (FIFO) buffers, and other desirable forms of data storage. As an example, the original memory access requests may be stored as entries in a linked list or in a static array.

By storing memory access requests that are being merged, information relating to each memory access request may be retained. For example, master modules that provide memory access requests to memory controller 12 may provide a tag identification (tag ID) for each memory access requests and may require that memory controller 12 provide the tag ID along with any response to the corresponding memory access request (e.g., data in response to a read request must be provided along with a tag ID associated with the read request). When memory access requests are merged, tag IDs associated with at least some of the memory access requests that were merged may be obtained from the information stored in storage circuitry 34.

Memory access requests in the queue may be processed using single-port memory controller module 36. Single-port memory controller module 36 may process each memory access request in the queue by providing the memory access request to system memory 14 via memory interface circuitry 38. Single-port memory controller module 36 may process the memory access requests in the queue sequentially or in any desired order. If desired, single-port memory controller module 36 may rearrange the order of the queue to maximize performance or conserve power.

Figure 4:
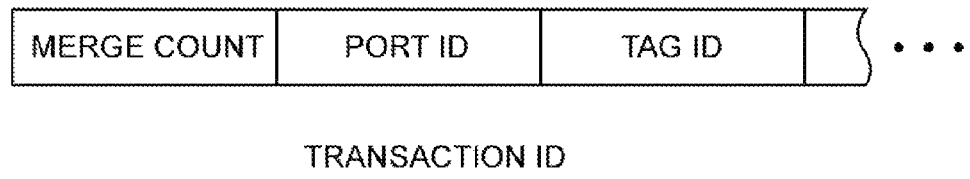
FIG. 4 is a diagram of an illustrative transaction identification (ID) that may be assigned to a memory access request in accordance with an embodiment of the present invention.

To associate scheduled memory access requests (e.g., merged memory access requests generated from two or more original memory access requests) with original memory access requests that are stored in storage circuitry 34, a transaction identifier (sometimes referred to herein as a transaction ID) may be assigned to each scheduled memory access request. FIG. 4 shows an illustrative transaction identifier (transaction ID) that may be associated with each scheduled memory access request. As shown in FIG. 4, the transaction ID may include information such as a merge count, a port identification (ID), and a tag ID. The port ID may identify the memory controller port at which the memory access request was received. The merge count may identify the number of memory access requests from the specified port that were merged to form the given memory access request. The tag ID may be a selected one of the tag IDs from the memory access requests identified for merging.

Figure 5:
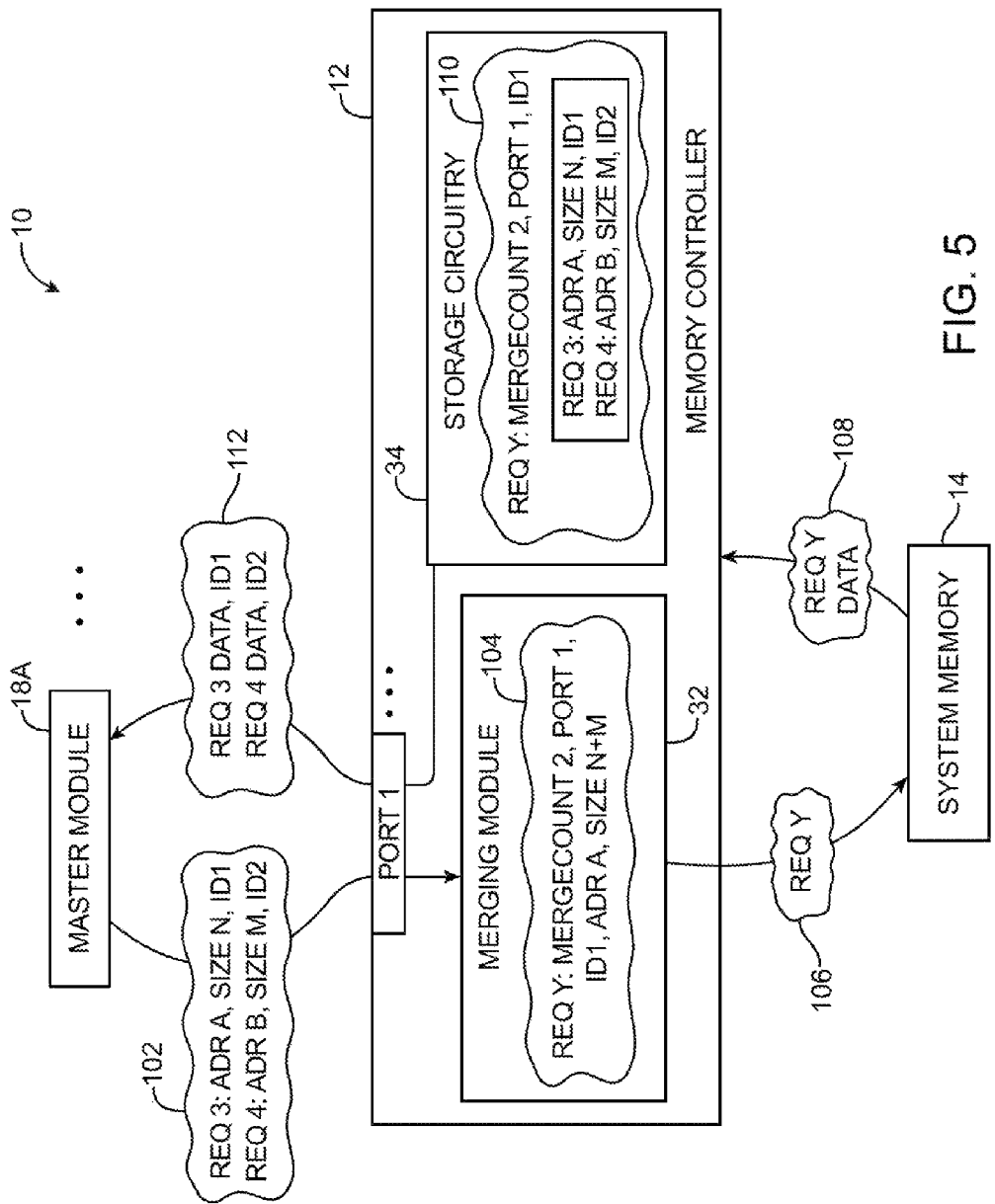
FIG. 5 is a diagram illustrating merging of two memory access requests in accordance with an embodiment of the present invention.

FIG. 5 illustrates a scenario in which a first memory access request REQ3 and a second memory access request REQ4 may be combined to form a merged memory access request REQY and in which a transaction ID may be used to associate request REQY with requests REQ3 and REQ4. In the example of FIG. 5, master module 18A may provide first memory access request REQ3 and second memory access request REQ4 to port 1 of memory controller 12 at step 102. Memory access request REQ4 may be provided after memory access request REQ3. Request REQ3 may request a portion of memory of size N at first address A (e.g., N minimum-sized blocks of memory starting from address A and ending at the address corresponding to the Nth memory block from address A).

Request REQ4 may request a portion of memory of size M at a second address B (e.g., REQ4 may request M minimum-sized blocks of memory from respective addresses B, B+1, B+2, . . . , B+M−1).

Master module 18A may provide requests REQ3 and REQ4 with corresponding identification tags ID1 and ID2. Master module 18A may expect responses to requests REQ3 and REQ4 to be accompanied by the appropriate tag ID that identifies the request. For example, master module 18A may provide a read access request REQ3 with a tag ID ID1. Request REQ3 may request data at a given address in system memory. In this scenario, the memory controller may fulfill the request by obtaining the requested data from system memory and providing the requested data to master module 18A along with tag ID1 to identify that the provided data is associated with request REQ3.

At step 104, memory controller 12 may receive requests REQ3 and REQ4 at port 1. Merging module 32 may identify that REQ3 and REQ4 may be combined (merged) into a single memory access request REQY. As an example, request REQ3 may request 2 blocks of data at address 0 and request REQ4 may request 2 blocks of data at address 2 (e.g., A equals 0, N equals 2, B equals 2, and M equals 2). In this scenario, merging module 32 may identify that the data requested by REQ3 and REQ4 may be obtained by issuing a single request REQY that requests four blocks of data at address 0. In response to identifying that REQ3 and REQ4 can be merged, merging module 104 may generate replacement request REQY. Data requested by REQY may include at least the data requested by REQ3 and REQ4 (e.g., REQ Y may request at least N+M blocks of data at address A).

To preserve the tag ID information that corresponds to each original memory access request (e.g., requests REQ3 and REQ4) after request REQY is generated, merging module 32 may assign an appropriate transaction ID to request REQY and may store the original requests in storage circuitry 34 along with the transaction ID of the request generated from the original requests (e.g., REQ3 and REQ4 may be stored along with the transaction ID of REQY). In the example of FIG. 5, request REQY may be assigned a transaction ID with a mergecount of 2, port ID of 1, and tag ID of ID1 (e.g., the transaction ID assigned to request R. to form request REQY, that the requests were received at port 1, and that one of the requests has a tag ID of ID1).

At step 106, memory controller 12 may issue request REQY to system memory 14 for fulfillment (e.g., memory controller 12 may use memory interface circuitry 38 to provide control signals to system memory 14 that direct system memory 14 to respond to memory access request REQY).

At step 108, memory controller 12 may receive a response from system memory 14. System memory 14 may, for example, respond by providing data requested by REQY.

At step 110, merging module 32 may use storage circuitry 34 to identify the original requests that correspond to the data received from system memory 14. As an example, merging module 32 may identify that the received data corresponds to request REQY and retrieve the requests associated with request REQY from storage circuitry 34. In this scenario, merging module 32 may use the port ID and tag ID associated with request REQY to uniquely identify the original requests that were merged to generate REQY (e.g., in the case that master processing modules that are coupled to different ports provide the same tag ID, the port ID may be used to differentiate the requests).

Merging module 32 may use the mergecount and the original requests retrieved from storage circuitry 34 to determine which portions of the received data correspond to each of the original requests. In the example of FIG. 5, merging module 32 may use the mergecount and the ID of request REQY to identify that two original requests were merged to form REQY and that the first original request has a tag ID of ID1. Merging module 32 may identify that request REQ3 corresponds to tag ID ID1 and identify that REQ3 requested a portion of data with size N. Merging module 32 may assign the first N blocks of the data received from system memory 14 to request REQ3 along with tag ID ID1. Merging module 32 may then identify that the next original request is REQ4 and use the size requested by request REQ4 to assign the next M blocks of the data received from system memory 14 to request REQ4. Merging module 32 may identify that tag ID ID2 corresponds to request REQ4 and assign tag ID ID2 to the data for request REQ4.

The example of merging module 32 assigning respective portions of data received from system memory to each of the original requests is merely illustrative. Data portions may also be assigned to each of the original requests by storage circuitry 34. For example, data received from system memory may be provided to storage circuitry 34. In this scenario, storage circuitry 34 may use stored data (e.g., mergecount and original request data) to identify which original requests should be assigned to which portions of the received data.

At step 112, the data assigned to original requests REQ3 and REQ4 may be returned along with the tag IDs retrieved during step 110. If desired, the data assigned to original requests REQ3 and REQ4 may be returned separately (e.g., as soon as the tag ID is retrieved from storage circuitry 34 in step 110).

The number of memory access requests that are merged in the example of FIG. 5 is merely illustrative. In general, any suitable number of memory access requests may be merged in sequence using merging module 32.

Figure 6:
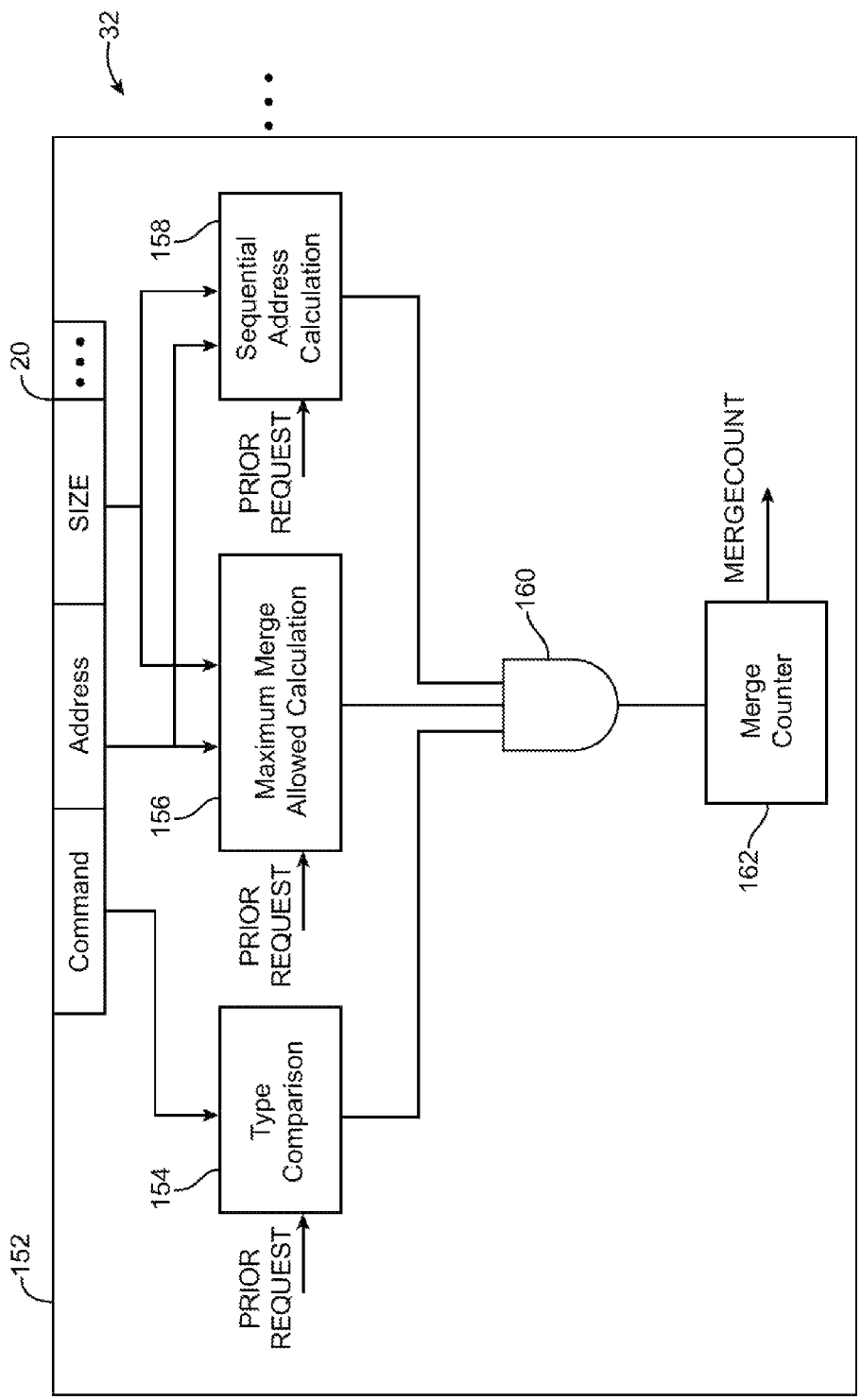
FIG. 6 is a diagram illustrating how a merging module identifies memory access requests for merging in accordance with an embodiment of the present invention.

To identify memory access requests that should be merged, merging module 32 may use information from pending memory access requests (e.g., requests that have been received from master modules but have yet to be issued) and information from current memory access requests (e.g., requests that are currently being received at memory controller ports). FIG. 6 shows a block diagram 152 of circuitry that may be used in a merging module 32 to identify memory access requests that should be merged. Merging module 32 may include a type comparison module 154, a maximum merge allowed calculation module 156, a sequential address calculation module 158, an AND gate 160, and a merge counter 162. Circuitry 152 may be provided for each memory controller port 20 to identify memory access requests that are received at that given memory controller port and that are eligible for merging.

As shown in FIG. 6, memory access requests received at a memory controller port 20 may include a command field, an address field, a size field (sometimes referred to as burst length), and other information relating to the memory access requests. The command field may indicate the type of command associated with the memory access request (e.g., a read access request or a write access request). The address field may indicate the address in system memory associated with the command. The size field may indicate the burst length associated with the request (e.g., a number of minimum-sized blocks of system memory to read or write).

Type comparison module 154 may compare the command field of a current request to the command field of a previously received (e.g., pending) memory access request. Type comparison module 154 may assert an output to AND gate 160 (e.g., output a logic one) when the command field of a current request matches the command field of a previously received request. In other words, the current request and a previously received request may be merged in response to identifying that the command field of the current request identifies the same command that is identified by the command field of the previously received request.

Maximum merge allowed calculation module 156 may identify whether the size and location of a portion of memory requested by a current request and the size and location of a portion of memory requested by a previous request (e.g., a pending request) can be merged into a single burst transaction. As an example, consider the scenario in which burst transactions begin and end at specified boundaries in system memory (e.g., a burst transaction may be required to start at addresses that are integer multiples of eight and to end at an address immediately before a next start address). In this scenario, a first request and a second request may be merged if data requested by the first request and data requested by the second request are contained within the boundaries of a given start address and ending address (e.g., first and second requests may not be allowed to merge if the data requested by the first request and the second request crosses a boundary). If the size and locations of the portions of memory requested by the pending request and the current request can be accessed with a single burst memory transaction, maximum merge allowed calculation module 156 may assert an output to AND gate 160.

Sequential address calculation module 158 may identify if a pending memory access request and a current memory access request attempt to access a contiguous portion of system memory. To identify contiguous portions of system memory, sequential address calculation module 158 may identify whether the starting address for the memory portion requested by the current request is immediately following the ending address for the memory portion requested by the pending request (e.g., if memory portion for the current request immediately follows the memory portion for the pending request). Sequential address calculation module 158 may also identify whether the starting address for the memory portion requested by the pending request is immediately following the ending address for the memory portion requested by the current address (e.g., if the memory portion for the current request immediately precedes the memory portion for the pending request).

Logic AND gate 160 may receive the output signals from type comparison module 154, maximum merge allowed calculation module 156, and sequential address calculation module 158 and may identify whether all of the output signals have been asserted for the current request. If desired, only the request received immediately prior to and at the same port as the current request may be examined in this way by circuitry 152. Alternatively, each pending request that has been scheduled for fulfillment but has not yet been issued may be examined in this way to identify potential pending requests that may be merged with the current request (if desired). As an example, each request in a fulfillment queue may be provided one at a time to appropriate circuitry 152 (e.g., circuitry 152 associated with the port that received the given request) to identify pending requests that may be merged with the current request.

The output of AND gate 160 may be coupled to merge counter module 162. Merge counter module 162 may identify the number of requests that have been merged for each request. For example, merge counter module 162 may increment a mergecount associated with each given request when AND gate 160 indicates that the given request should be merged with a current request. Memory access requests that have not been merged with any other requests may have a mergecount initialized to zero. In this way, a mergecount may be provided for each transaction ID associated with a given scheduled memory access request.

Figure 7:
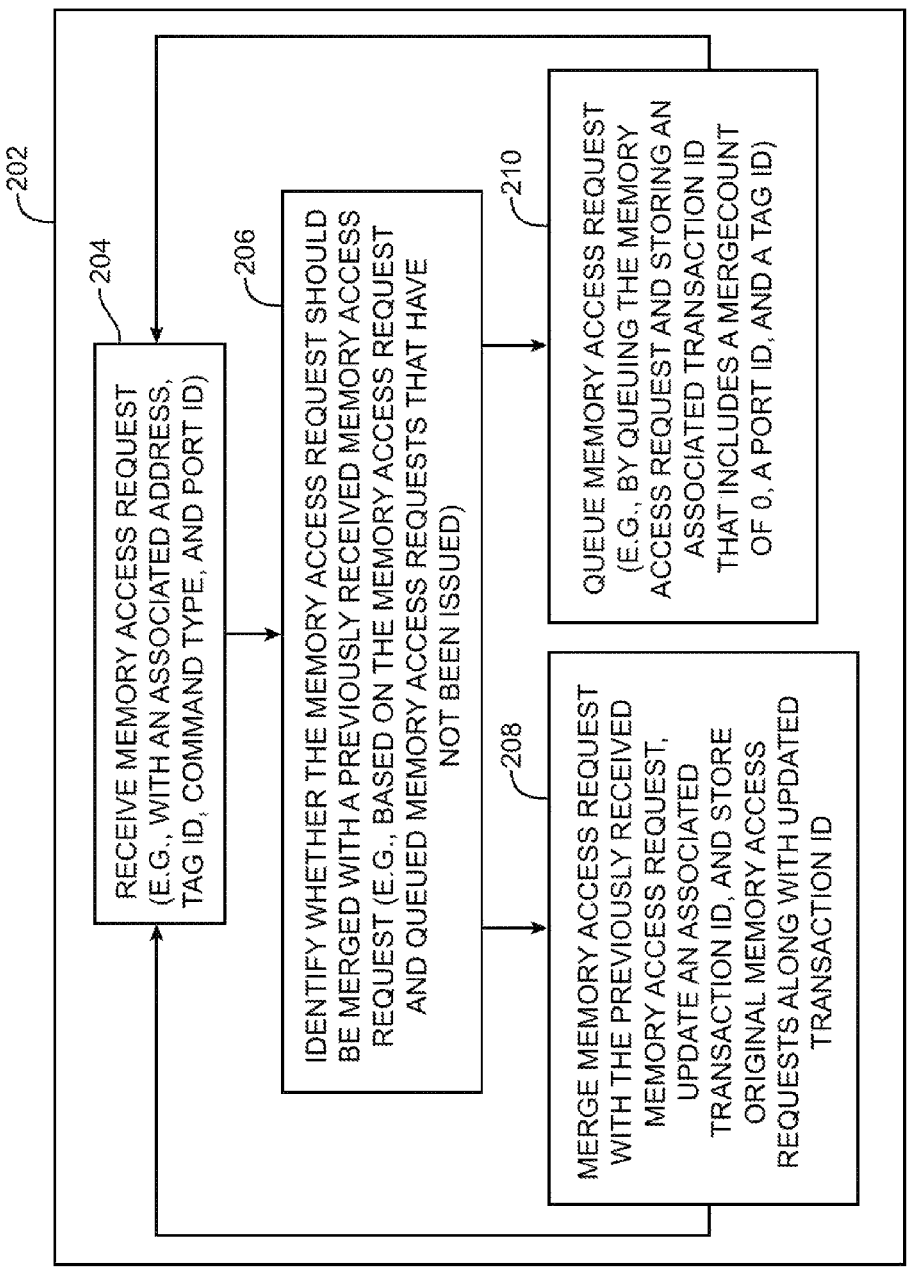
FIG. 7 is a flow chart of illustrative steps for merging memory access requests received from master modules in accordance with an embodiment of the present invention.

To merge memory access requests and providing transaction IDs for each memory access request that is scheduled for fulfillment, a memory controller 12 with a merging module 32 may perform the illustrative steps of flowchart 202 as shown in FIG. 7.

In step 204, memory controller 12 may receive a memory access request at a port that has a port ID (e.g., from a master processing module 18 coupled to one of memory controller ports 18). The memory access request may request to access a portion of system memory with a given size at a given address. The memory access request may include a tag ID that identifies the memory access request. The tag ID and the port ID may be used to uniquely identify the memory access request.

In step 206, memory controller 12 may identify whether the memory access request should be merged with a previously received memory access request. For example, the memory controller may identify a previously received memory access request that has the same command type and can be fulfilled with the current memory access request by a single burst memory transaction. If the memory controller identifies a previously received memory access request that should be merged with the current memory access request, the memory controller may perform the operations of step 208. If the memory controller identifies that no pending memory access requests should be merged with the currently received memory access request, the memory controller may perform the operations of step 210.

In step 208, memory controller 12 may merge the previous memory access request (identified in step 206) with the currently received memory access request to generate a new memory access request that encompasses both the current memory access request and the previous memory access request (e.g., the new memory access request may request a portion of system memory that encompasses the portions of system memory requested by the previous memory access request and the current memory access request). Memory controller 12 may generate a new transaction ID for the new memory access request by updating the transaction ID associated with the previous memory access request. For example, memory controller 12 may update the mergecount of the previous memory access request to generate the new transaction ID. The generated memory access request may replace the previous memory access request in the fulfillment queue. The process may then loop back to step 204.

In step 210, memory controller 12 may queue the current memory access request for fulfillment. Memory controller 12 may generate an associated transaction ID with a mergecount of zero, with a port ID equal to the port ID of the port that received the memory access request, and the tag ID of the received memory access request. The process may then loop back to step 204.

Figure 8:
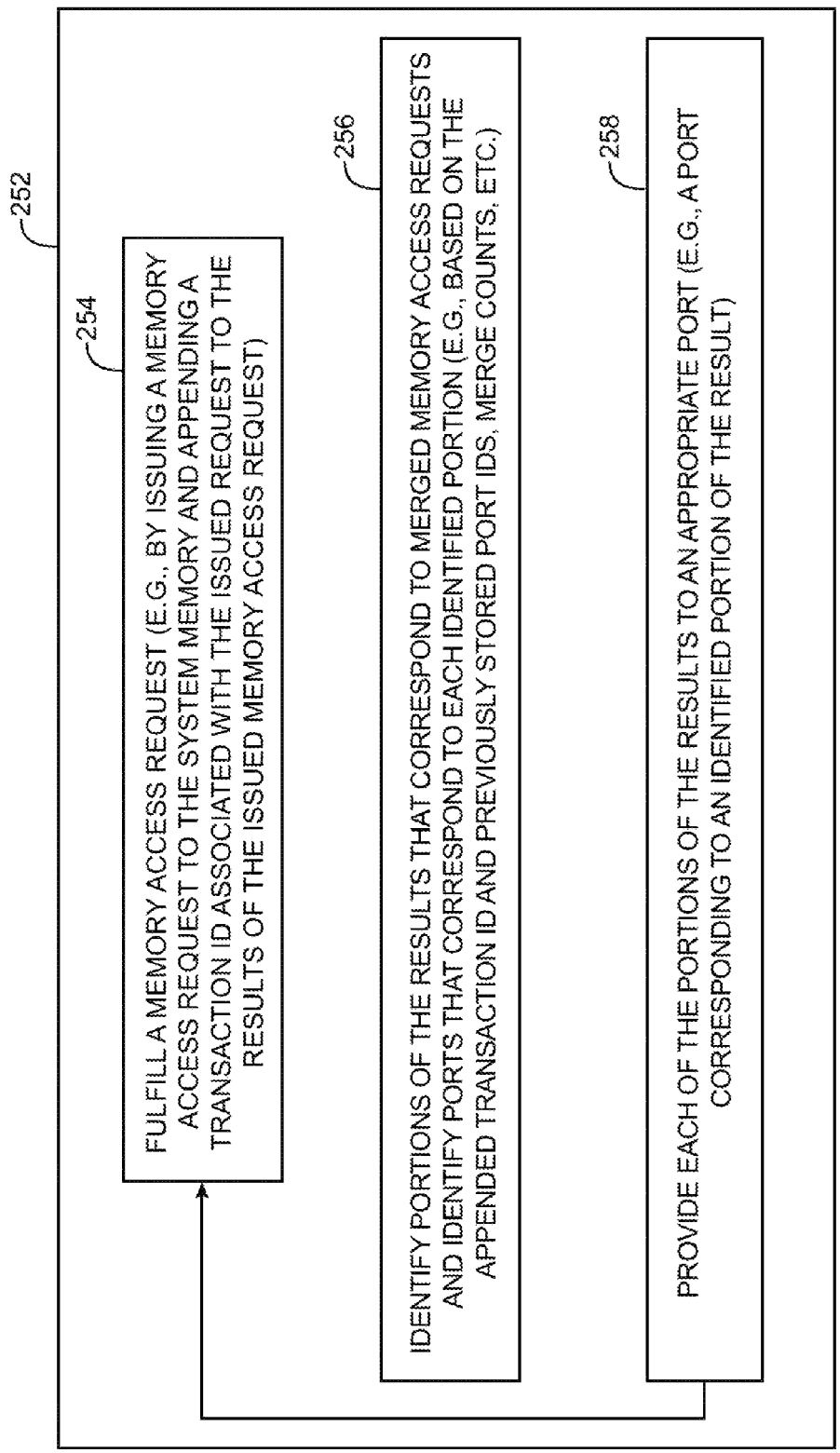
FIG. 8 is a flow chart of illustrative steps for fulfilling merged memory access requests in accordance with an embodiment of the present invention.

To fulfill memory access requests that have been scheduled and to recover memory access requests that were merged (e.g., merged in steps 204-208 of FIG. 7), a memory controller 12 with a merging module 32 may perform the illustrative steps of flowchart 252 as shown in FIG. 8.

In step 254, memory controller 12 may fulfill a memory access request (e.g., memory controller 12 may obtain the next memory access request in the fulfillment queue and configure system memory 14 to respond to the memory access request). Memory controller 12 may assign the transaction ID of the memory access request to the results of the fulfilled memory access request. For example, memory controller 12 may assign the transaction ID of a read access request to the data obtained from system memory. As another example, memory controller 12 may assign the transaction ID of a write access request to a confirmation that data associated with the write access request was written successfully. If desired, the write confirmation may be produced by the memory controller after the write access request was issued (e.g., after system memory was configured to respond to the write access request).

In step 256, memory controller 12 may identify original memory access requests associated with the fulfilled memory access request by using the transaction ID and information stored in storage circuitry 34. For example, if two memory access requests were merged to produce the memory access request that was fulfilled, the two memory access requests may be recovered from storage circuitry 34 using the transaction ID of the fulfilled memory access request (e.g., using the mergecount field, port ID field, tag ID field, previously stored port IDs, mergecounts, etc). Configured in this way, memory controller 12 may identify which portions of data obtained from system memory should be assigned to each original memory access request.

In step 258, memory controller 12 may provide the results of each original memory access request along with the tag ID of the original memory access request to the master module 18 that provided the original memory access request.

The operations of flow chart 202 and flow chart 252 may be performed simultaneously by memory controller 12 to receive and merge memory access requests (FIG. 7) and fulfill and recover merged memory access requests (FIG. 8).

Figure 9:
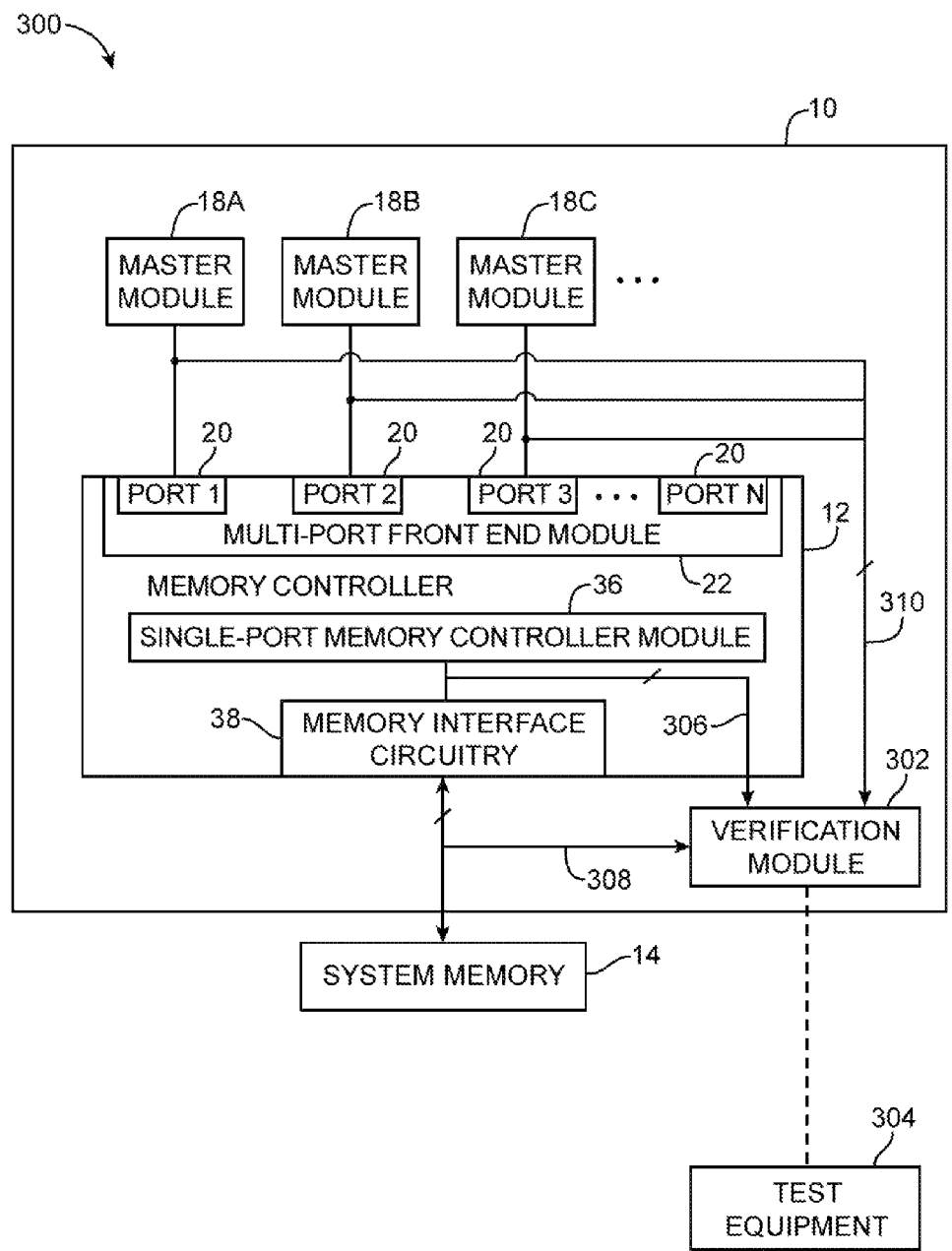
FIG. 9 is a diagram of an illustrative integrated circuit with a memory controller and a verification module that may be used to optimize the design of master modules in the integrated circuit in accordance with an embodiment of the present invention.

It may be desirable to optimize the configuration of master modules 18 based on the operation of memory controller 12 and system memory 14. For example, it may be desirable for a master module 18 to provide memory access requests that can be merged by memory controller 12. FIG. 9 shows an illustrative test system 300 that may be used to optimize the configuration of master modules 18 (e.g., master modules 18A, 18B, and 18C).

Test system 300 may include device 10, system memory 14, and test equipment 304. Device 10 may include master modules 18, memory controller 12, and verification module 302. Memory controller 12 may include multi-port front end module 22, single-port memory controller module 36, and memory interface circuitry 38. Verification module 302 may have a first input coupled to the path between single-port memory controller module 36 and memory interface circuitry 38 via path 306, a second input coupled to the path between of memory interface circuitry 38 and system memory 14 via path 308, and a third input coupled to the paths between master modules 18 and ports 20 of memory controller 12 via path 310.

Verification module 302 may monitor memory access requests provided to and fulfilled by memory controller 12 via paths 306, 308, and 310. Verification module 302 may be used to monitor the order and time at which memory access requests are received by memory controller 12 from master modules 18 (e.g., via path 310). Verification module 302 may be used to monitor the order and time at which the memory access requests are issued to system memory 14 (e.g., via paths 306 and 308). Verification module 302 may provide the monitored data to test equipment 304.

Test equipment 304 may analyze the monitored results to optimize the design and/or configuration of master modules 18. For example, test equipment 304 may use the monitored results to identify that memory access requests provided by master module 18A are not being merged by memory controller 12. As another example, test equipment 304 may use the monitored results to identify that memory access requests provided by master module 18A are significantly delayed relative to memory access requests provided by master module 18B. A user may use the identified results to optimize the design of master modules 18 to improve performance of the memory subsystem (e.g., the performance of memory controller 12 and system memory 14).

Figure 10:
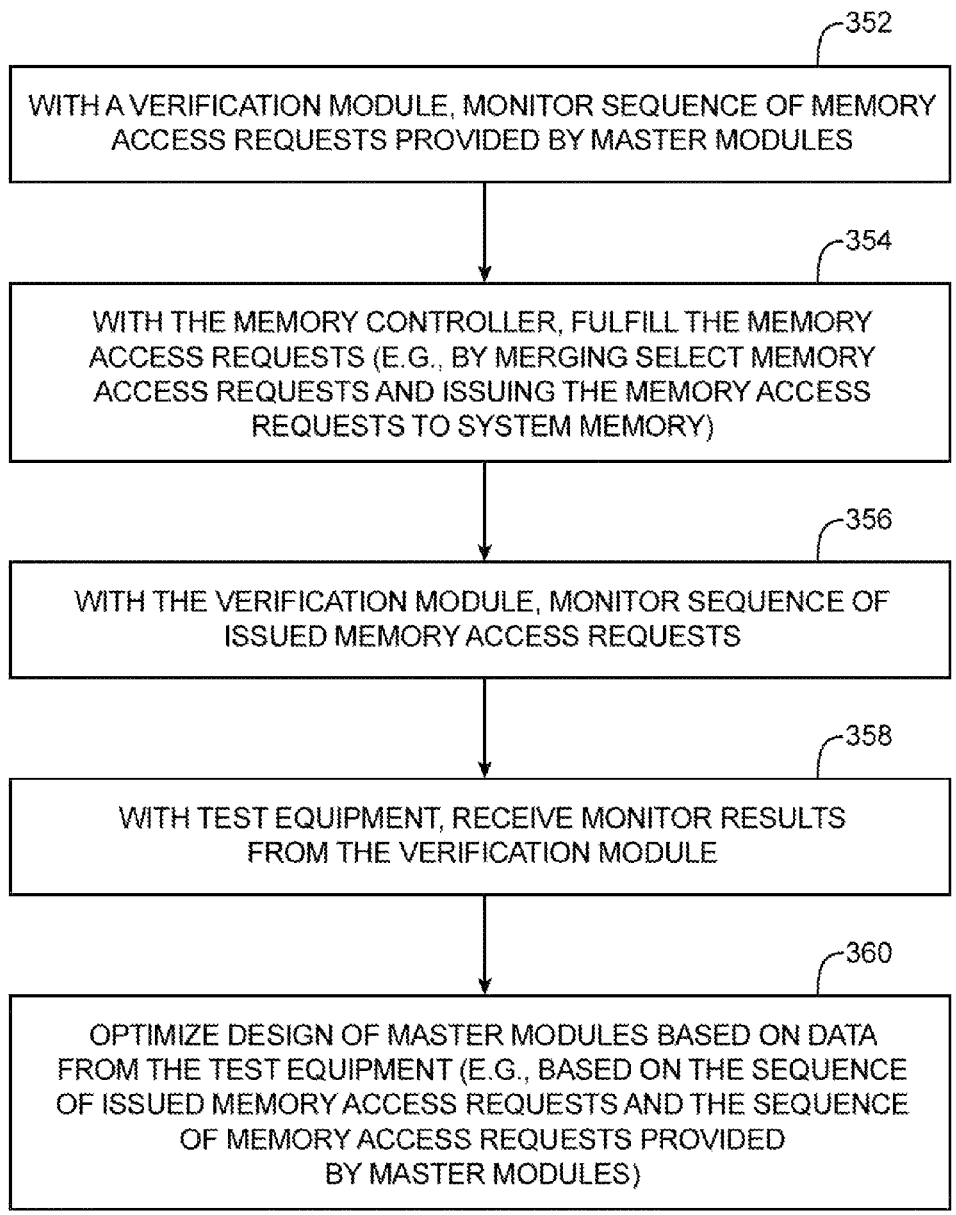
FIG. 10 is a flow chart of illustrative steps for optimizing the design of a master module using a verification module of the type shown in connection with FIG. 9 in accordance with an embodiment of the present invention.

FIG. 10 shows illustrative steps that may be performed using test equipment 304 coupled to a device 10 that has a verification module 302.

In step 352, verification module 302 may monitor a sequence of memory access requests provided by master modules 18. Verification module 302 may monitor the order and time at which the memory access requests are received by a memory controller 12.

In step 354, memory controller 12 may fulfill the memory access requests (e.g., by merging select memory access requests and issuing the memory access requests to system memory 14).

In step 356, verification module 302 may monitor a sequence of issued memory access requests. Verification module 302 may monitor the order and time at which the memory access requests are issued from memory controller 12 to system memory 14.

In step 358, test equipment 304 may receive data from verification module 302 that correspond to monitored sequence of issued and received memory access requests.

In step 360, the design of master modules 18 may be optimized based on data from test equipment. For example, the test equipment may identify that few memory access requests from one of master modules 18 were merged. The test equipment may indicate that the memory access requests were not merged because they did not fulfill burst memory transaction boundary conditions (e.g., because maximum merge allowed calculation module 156 produced an output of zero). In this scenario, the master module may be re-designed to fulfill the burst memory transaction boundary conditions.

The foregoing is merely illustrative of the principles of this invention and various modifications can be made by those skilled in the art without departing from the scope and spirit of the invention. The foregoing embodiments may be implemented individually or in any combination.

What is claimed is:

1. A method of fulfilling a memory access request with a memory controller operable to communicate with memory, comprising:
   receiving the memory access request at a plurality of ports of the memory controller;
   with the memory controller, identifying which port of the plurality of ports received the memory access request;
   with the memory controller, identifying whether the memory access request should be merged with a memory access request previously received at the identified port;
   with the memory controller, issuing a merged memory access request based on the memory access request and the previously received memory access request;
   with the memory controller, receiving data from the memory that corresponds to the merged memory access request; and
   with the memory controller, partitioning the received data into a first portion associated with the memory access request and a second portion associated with the previously received memory access request.

2. The method defined in claim 1 wherein identifying whether the memory access request should be merged with the previously received memory access request comprises:
   identifying that the memory access request and the previously received memory access request comprise read access requests.

3. The method defined in claim 1 wherein identifying whether the memory access request should be merged with the previously received memory access request comprises:
   identifying that the memory access request and the previously received memory access request comprise write access requests.

4. The method defined in claim 1 wherein the memory access request requests access to a first data portion of a first size from the memory, wherein the previously received memory access request requests access to a second data portion of a second size from the memory, and wherein identifying whether the memory access request should be merged with the previously received memory access request comprises:
   identifying whether the memory access request should be merged with the previously received memory access request based at least partially on the first and second sizes.

5. The method defined in claim 4 wherein the first data portion is located at a first address, wherein the second data portion is located at a second address, and wherein identifying whether the memory access request should be merged with the previously received memory access request further comprises:
   identifying whether the memory access request should be merged with the previously received memory access request based at least partially on the first and second addresses.

6. The method defined in claim 4 wherein identifying whether the memory access request should be merged with the previously received memory access request further comprises:
   identifying that the first and second data portions occupy a contiguous portion of the memory.

7. The method defined in claim 1, wherein the memory controller includes storage circuitry, wherein the memory access request includes a first identification tag, and wherein the previously received memory access request includes a second identification tag, the method further comprising:
   storing the memory access request having the first identification tag and storing the previously received memory access request having the second identification tag in the storage circuitry.

8. The method defined in claim 1 further comprising:
   generating a count that indicates how many memory access requests have been merged to form the merged memory access request.

9. The method defined in claim 7 further comprising:
   generating a count that indicates how many memory access requests have been merged to form the merged memory access request;
   selecting an identification tag from the first and second identification tags;
   generating a transaction identifier from the count, the port, and the selected identification tag; and
   assigning the transaction identifier to the merged memory access request.

10. The method defined in claim 9 wherein partitioning the received data into the first portion associated with the memory access request and the second portion associated with the previously received memory access request comprises:

identifying the first and second portions based at least partly on the transaction identifier and the stored memory access requests.

11. A memory controller having a plurality of ports that each receives at least one memory access request of at least first and second memory access requests that have associated identification tags from master circuitry on an integrated circuit, the memory controller comprising:

a merging module that generates a merged memory access request from the at least first and second memory access requests, wherein the merging module determines which of the plurality of ports receives the first and second memory access requests and generates the merged memory access request in response to identifying that the first memory access request and the second memory access request were received at the same port; and storage circuitry operable to store the at least first and second memory access requests and the identification tags that are associated with the at least first and second memory access requests.

12. The memory controller defined in claim 11 wherein the merging module is operable to generate the merged memory access request in response to identifying that the first memory access request and the second memory access request have the same command type.

13. The memory controller defined in claim 11 wherein the at least first and second memory access requests have associated addresses and sizes and wherein the merging module comprises circuitry operable to identify that the at least first and second memory access requests should be merged based at least partly on the addresses and the sizes associated with the at least first and second memory access requests.

14. The memory controller defined in claim 11 wherein the memory controller is operable to issue the merged memory access request to memory and to receive data associated with the merged memory access request from the memory and wherein the merging module is operable to partition the received data based on the stored memory access requests and the stored identification tags.

15. A method comprising:

with circuitry on an integrated circuit, monitoring a memory controller to identify an order in which memory access requests are received at the memory controller and to identify an order in which the memory access requests are fulfilled by the memory controller, wherein monitoring the memory controller to identify the order in which the memory access requests are received at the memory controller and to identify the order in which the memory access requests are fulfilled by the memory controller comprises:

monitoring input and output ports of the memory controller.

16. The method defined in claim 15 further comprising:

with test equipment, analyzing the order in which memory access requests are received at the memory controller and the order in which the memory access requests are fulfilled by the memory controller.

17. The method defined in claim 16 wherein the memory access requests are received at the memory controller from a processing module, further comprising:

reconfiguring the processing module based at least on the order in which the memory access requests are fulfilled by the memory controller.

18. The method defined in claim 17 further comprising:

reconfiguring the processing module based at least on the order in which memory access requests are received at the memory controller from the processing module.

19. The method defined in claim 15 wherein identifying the order in which the memory access requests are received at the memory controller comprises identifying tags associated with the memory access requests, the method further comprising:

identifying the order in which the memory access requests are fulfilled by the memory controller based at least partly on the identified tags.

* * * * *